United States Patent [19]
Sun et al.

[11] Patent Number: 6,010,931
[45] Date of Patent: Jan. 4, 2000

[54] PLANARIZATION TECHNIQUE FOR DRAM CELL CAPACITOR ELECTRODE

[75] Inventors: Shih-Wei Sun, Taipei; Tri-Rung Yew, Hsin-Chu, both of Taiwan

[73] Assignee: United Microelectronics Corp., Taiwan

[21] Appl. No.: 08/864,299

[22] Filed: May 28, 1997

Related U.S. Application Data

[60] Provisional application No. 60/036,144, Jan. 21, 1997.

[51] Int. Cl.[7] .............................................. H01L 21/8242
[52] U.S. Cl. ........................................... 438/240; 438/255
[58] Field of Search .................................. 438/238, 239, 438/253, 254, 255, 396, 397, 398, 240

[56] References Cited

U.S. PATENT DOCUMENTS

| | | | |
|---|---|---|---|
| 5,501,998 | 3/1996 | Chen | 437/52 |
| 5,668,036 | 9/1997 | Sune | 438/253 |
| 5,702,989 | 12/1997 | Wang et al. | 438/397 |
| 5,770,498 | 6/1998 | Becker | 438/239 |
| 5,843,818 | 12/1998 | Joo et al. | 438/240 |

*Primary Examiner*—Joni Chang
*Attorney, Agent, or Firm*—Rabin & Champagne, P.C.

[57] ABSTRACT

A method of forming a DRAM includes forming a transfer FET on a substrate, the FET having a gate on a gate oxide layer above the substrate and a first and second source/drain region in the substrate on either side of a channel region under the gate. The first and second source/drain regions are typically exposed or nearly exposed in a spacer etch process. A silicon nitride etch stop layer is deposited over the entire structure and then a thick layer of oxide is deposited on the device. Chemical mechanical polishing is performed to provide a planar surface on the thick oxide layer. An opening is formed through the thick layer of oxide above the first source/drain region, stopping at the etch stop layer. The etch stop layer is removed within the opening in the thick layer of oxide and the underlying thin oxide layer is etched. A capacitor electrode can then be formed in contact with the exposed portion of the first source/drain region. A similar self-aligned method can be used to form the bit line contact for the device using the etch stop layer as a stop for the bit line contact etch. Practice of the method provides a manufacturing method having improved reliability and ease of use, particularly when practiced for DRAM capacitors that incorporate high dielectric constant dielectrics. The materials preferred for use within such DRAM capacitors have smaller process margins and so particularly benefit from the improved structure and process.

28 Claims, 5 Drawing Sheets

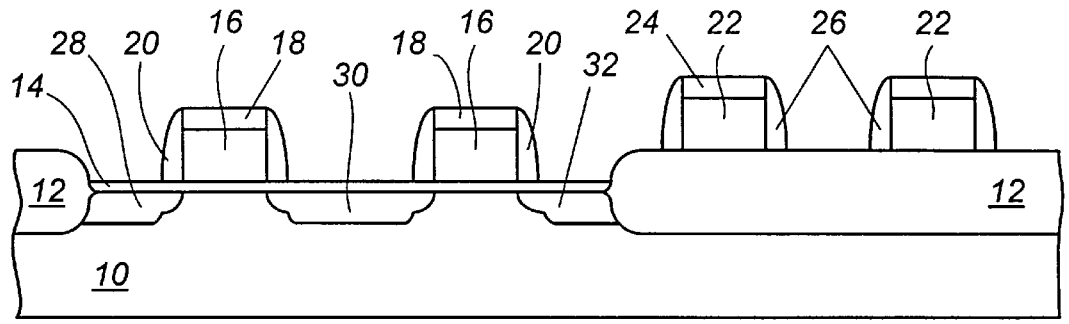
FIG. 1 -- Prior Art
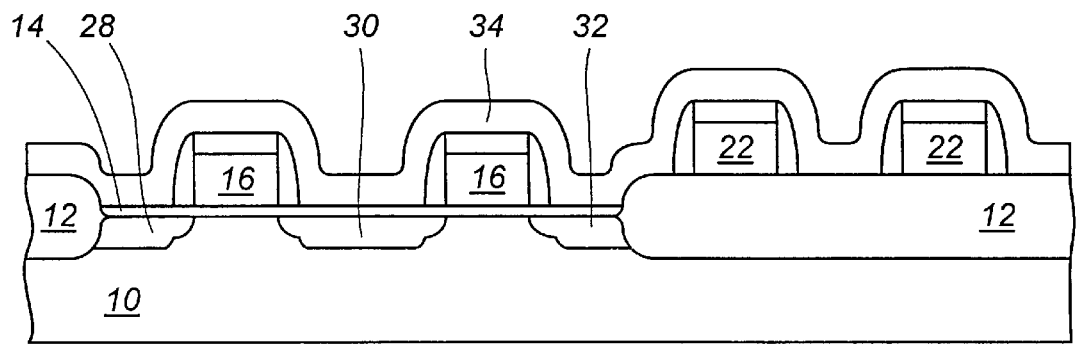
FIG. 2 -- Prior Art
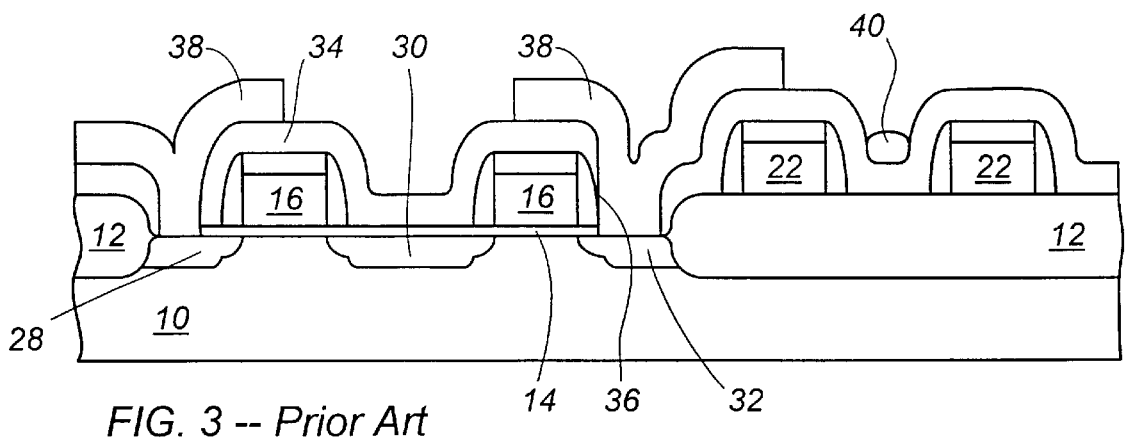
FIG. 3 -- Prior Art

PLANARIZATION TECHNIQUE FOR DRAM CELL CAPACITOR ELECTRODE

This application claims priority from provisional application Ser. No. 60/036,144, filed Jan. 21, 1997.

BACKGROUND OF THE INVENTION

1. Field of the Invention

The present invention relates to the formation of high density integrated circuits and, more particularly, to the formation of high density dynamic random access memories.

2. Description of the Related Art

There is a continuing trend toward increasing the storage density of integrated circuit memories to provide increased levels of data storage on a single chip. Higher density memories provide storage that is generally more compact and is often cheaper on a per bit basis than an equivalent amount of storage provided on plural chips. It has generally been possible to provide these higher levels of storage at equivalent or improved levels of performance as compared to the earlier, less dense memory chips. Historically, the density of integrated circuit devices has been increased in part by decreasing the size of structures such as wiring lines and transistor gates as well as by decreasing the separation between the structures that make up the integrated circuit device. Reducing the size of circuit structures is generally referred to as decreasing the "design rules" used for the manufacture of the integrated circuit device.

In dynamic random access memories (DRAMs), information is typically stored by selectively charging or discharging each capacitor of an array of capacitors formed on the surface of a semiconductor substrate. Most often, a single bit of binary information is stored at each capacitor by associating a discharged capacitor state with a logical zero and a charged capacitor state with a logical one. The surface area of the electrodes of the memory capacitors determines the amount of charge that can be stored on each of the capacitors for a given operating voltage, for the electrode separation that can reliably be manufactured, and for the dielectric constant of the capacitor dielectric typically used between the electrodes of the charge storage capacitor. Read and write operations are performed in the memory by selectively coupling the charge storage capacitor to a bit line to either transfer charge to or from the charge storage capacitor. The selective coupling of the charge storage capacitor to the bit line is typically accomplished using a transfer field effect transistor (FET). The bit line contact is typically made to one of the source/drain electrodes of the transfer FET and the charge storage capacitor is typically formed in contact with the other of the source/drain electrodes of the transfer FET. Word line signals are supplied to the gate of the FET to connect one electrode of the charge storage capacitor through the transfer FET to the bit line contact facilitating the transfer of charge between the charge storage capacitor and the bit line.

FIG. 1 shows in schematic cross-section two memory cells of a DRAM at an intermediate stage of manufacture. The illustrated DRAM cells are formed on a P-type substrate 10 and include field oxide regions 12 to provide isolation from other, adjacent memory cells. A gate oxide layer 14 is formed by thermal oxidation on the active device region between the field oxidation regions and polysilicon gate electrodes 16 are formed on the gate oxide layer 14. The two gate electrodes 16 illustrated in FIG. 1 are incorporated into the two independent transfer FETs for the two illustrated memory cells. Polysilicon gate electrodes 16 are formed by depositing a layer of undoped polysilicon over the substrate, typically using low pressure chemical vapor deposition (LPCVD), and then implanting impurities into the polysilicon and activating the impurities to render the polysilicon layer conductive. The gate electrodes are then patterned using conventional photolithography techniques. A layer of silicon oxide 18 is provided over the polysilicon gate electrodes 16 to protect the gate electrodes in subsequent processing steps and, often, to serve as an etch stop for subsequent etching steps. Sidewall oxide spacer structures 20 are formed adjacent the gate electrodes when a two stage implantation process (discussed below) is used in the formation of the source/drain regions. At the same time that the gate electrodes 16 are formed, wiring lines 22 which connect different gate electrodes are formed on field oxide regions 12. Because the wiring lines are generally formed in the same process used to form the gate electrodes 16, the wiring lines have a structure similar to the gate electrodes. As illustrated, the wiring lines typically include polysilicon layers 22 covered by oxide layers 24 with sidewall oxide spacer structures 26 formed on either side of the polysilicon wiring lines 22.

Doped source/drain regions 28, 30 and 32 are formed on either side of the polysilicon gate electrodes 16 to define the channel regions of the transfer FETs. The source/drain region 30 that is common to the transfer FETs will serve as the bit line contact for the two illustrated transfer FETs. Lightly doped drain (LDD) structures are often used in small design rule memory transistors of the type that are primarily used in modem memory and logic devices. LDD source/drain regions 28, 30 and 32 are typically formed in a two step process, beginning with a relatively low level dopant implantation made self-aligned to the polysilicon gate electrodes 16. Spacer oxide regions 20 are then formed on either side of the gate electrodes 16 by first depositing by chemical vapor deposition (CVD) a layer of silicon oxide over the device and then anisotropically etching back the oxide layer to expose the substrate over the source/drain regions 28, 30 and 32. Etching back the CVD oxide layer produces the spacer oxide regions 20 on either side of the polysilicon gate electrodes 16 and on either side of the polysilicon wiring lines 22. After the spacer oxide regions 20 are provided on either side of the polysilicon gate electrodes 16, a second, heavier ion implantation is made into the source/drain regions 28, 30 and 32, self-aligned to the spacer oxide regions 20.

After the formation of the transfer FETs of the DRAM cells, conventional processing continues to form the charge storage capacitors by first depositing over the FIG. 1 structure a layer 34 of an insulating material such as CVD silicon oxide. The resulting structure is shown in FIG. 2. Openings 36 are then formed by conventional photolithography through the silicon oxide layer 34 to expose the source/drain regions 28, 32 of the substrate. Referring now to FIG. 3, a layer of undoped polysilicon 38 is next deposited by low pressure chemical vapor deposition (LPCVD) over the surface of the device and within the openings 36 in contact with source/drain regions 28, 32. Polysilicon layer 38 forms at least part of the lower electrode of the charge storage capacitor for the DRAM memory cells. The layer is doped, typically using N-type dopants, either in situ during deposition or by ion implantation and annealing and then the lower electrodes 38 are defined by photolithography. A capacitor dielectric layer, such as a two layer structure of silicon nitride and silicon oxide, is provided over the surfaces of the lower electrodes 38. Upper capacitor electrodes are then formed by depositing, doping and patterning a layer of polysilicon, as is well known.

Processing continues by blanket depositing a layer of interlayer dielectric material, such as a doped glass deposited by atmospheric pressure CVD from a TEOS source gas, over the DRAM structure. A bit line contact opening is formed through the dielectric layer by conventional photolithography to expose the common source/drain contact 30. A bit line contact is formed, typically consisting of one or more layers of metal deposited by sputtering or CVD over the device and in contact with common source/drain region 30 within the bit line contact opening. The bit line is then patterned and further processing is performed to complete the device.

Reducing the design rules used for forming the devices within a high density DRAM places heightened demands on many of the structures illustrated in FIGS. 1–3 and places heightened demands on the processing techniques used for forming the structures. Such demands on processing and the structures of the DRAM can reduce yields and increase the cost of the DRAM. It is therefore desirable to provide more manufacturable and more reliable methods of forming a DRAM.

SUMMARY OF THE PREFERRED EMBODIMENTS

One aspect of the present invention provides a method of forming a DRAM on a substrate having device isolation structures formed thereon, where an active device region is defined between the device isolation structures. An insulating layer is provided on the substrate over the active device region and first and second transfer transistors are provided on the active device region, the first transfer transistor including a first gate electrode over the insulating layer, and first and second source/drain regions formed in the substrate, the second transfer transistor including a second gate electrode over the insulating layer, the second source/drain region and a third source/drain region formed in the substrate. The first and second transfer transistors share the second source/drain region. An etch stop layer is provided over the first and second gate electrodes and over the first, second and third source/drain regions. A dielectric layer different from the etch stop layer is formed over the etch stop layer. The method continues by etching through the dielectric layer above the second source/drain region, stopping the etching process on the etch stop layer, performing a further etching process to etch through the etch stop layer and then forming a bit line contact to the second source/drain region. The dielectric layer is etched from above the third source/drain region. This etching process is stopped on the etch stop layer, a further etching process etches through the etch stop layer and then a charge storage capacitor is formed having an electrode connected to the third source/drain region.

Certain preferred embodiments of the present invention provide an etch stop layer over both the capacitor electrode contact and over the bit line contact of a transfer FET. Practice of these embodiments of the invention provides greater process latitude for the manufacture of high density DRAMs. An etch stop layer used in this manner protects the source/drain regions of the transfer FET from undesirable overetching and facilitates formation of self-aligned contacts to the source/drain regions.

Another aspect of the present invention forms a DRAM on a substrate having device isolation structures and an active device region defined between the device isolation structures. An insulating layer is provided on the substrate over the active device region and a transfer transistor is formed on the active device region, the transfer transistor including a first gate electrode over the insulating layer, and first and second source/drain regions formed in the substrate. An etch stop layer is provided over the first gate electrode and over the first and second source/drain regions and a dielectric layer different from the etch stop layer is formed over the etch stop layer. The surface of the dielectric layer is planarized and then the method etches through the planarized surface of the dielectric layer above the first source/drain region, and stop the etching process on the etch stop layer. A further etching process etches through the etch stop layer and then forms a bit line contact to the first source/drain region. The planarized surface of the dielectric layer is etched above the second source/drain region, and the method continues by stopping the etching process on the etch stop layer, performing a further etching process to etch through the etch stop layer and then forming a charge storage capacitor having an electrode connected to the second source/drain region. In a particular embodiment of this aspect of the invention, the surface of the dielectric layer is planarized by chemical mechanical polishing.

Another feature of some of the preferred embodiments provides a more planar surface over the substrate for the process steps used to form the DRAM capacitor. When a polysilicon or other conductor is deposited over a planarized interlayer dielectric, subsequent etching steps used to define the lateral extent of a capacitor electrode formed from the polysilicon or other conductor can be performed with greater reliability. This is because the polysilicon or other conductor will have a far more predictable thickness than is obtained for more conventional DRAM processes so that an etch process will more reliably complete the etching step so as to clean the unwanted portions of the polysilicon or other conductor from the interlayer dielectric. While this feature is valuable for DRAMs in general, the feature finds particular value in those DRAM capacitors that use high dielectric constant capacitor dielectrics because such dielectric materials are typically used with capacitor electrode materials that suffer from relatively low etch selectivity with typical interlayer dielectric materials.

BRIEF DESCRIPTION OF THE DRAWINGS

FIGS. 1–3 illustrate steps in the conventional process of forming a DRAM.

DETAILED DESCRIPTION OF THE PREFERRED EMBODIMENTS

Figure 4:
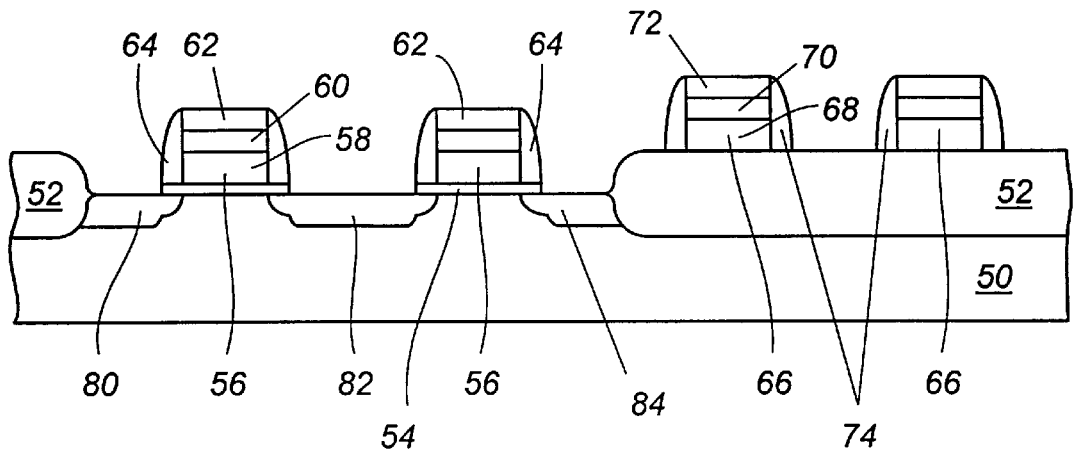
FIGS. 4–11 illustrate steps in forming a DRAM in accordance with a preferred embodiment of the present invention.

The use of stacked capacitor structures, as well as other aspects of the structure and manufacture of a high density DRAM like that shown partially completed in FIG. 3, introduces considerable variations into the topography present on the surface of a DRAM, particularly at intermediate steps in the manufacturing process. The presence of such variations on the surface of a device can make subsequent manufacturing steps on the device more difficult and less accurate. For example, the uneven surface of the FIG. 2 device can introduce distortions into photolithography steps performed over the surface of the FIG. 2 device. High resolution steppers of the type used for photolithography in the manufacture of high density memories have limited depths of field. Thus, when a photoresist layer is exposed to form a mask over an uneven surface such as that illustrated in FIG. 2, the surface variations can make portions of the image projected by the stepper out of focus within the photoresist layer. The image projected by the stepper for exposing the photoresist may thus be out of focus at different depths within the photoresist layer. The distorted exposure of the photoresist layer may form a distorted mask, and use of such a distorted mask for an etching or other process may produce structures that have an undesirable, distorted shape. Because of this, it is desirable to not have a significantly uneven (e.g., as compared to the depth of field of the stepper) surface on the device at intermediate steps during the manufacturing process.

Another detrimental aspect of surface topography at intermediate stages of device processing is that the conductive layers deposited over the interlayer dielectric that are to be incorporated within capacitor electrodes may have considerable variations in thickness. Such variations in thickness can have a negative impact on etching steps. Referring once again to FIG. 2, after contact holes are formed through the interlayer dielectric layer 34, polysilicon layer 38 is deposited over the surface of the device. This second level polysilicon will be patterned to form at least a portion of the lower electrode of a DRAM charge storage capacitor. Polysilicon is typically deposited using low pressure chemical vapor deposition (LPCVD) in a substantially conformal manner. The aspect ratios of certain spaces between structures on the surface of the FIG. 2 device are sufficient that the spaces are completely filled and the surface of the polysilicon layer is relatively smooth over the spaces. Consequently, the polysilicon layer 38 is particularly thick over spaces such as the one between the two wiring lines 22.

After photolithography to form a mask over the polysilicon layer 38, the extent of the lower capacitor electrode 38 (FIG. 3) is defined by etching using an anisotropic etch process such as plasma etching using an etchant derived from HCl and HBr. When there are considerable variations in the thickness of the polysilicon layer to be etched, it is typically necessary to etch sufficiently long to remove the thickest exposed portion of the polysilicon layer. This etch duration is unnecessarily long for most of the polysilicon layer. Accordingly, such an overetch process is undesirable as reducing the throughput of the manufacturing process. The overetch used to clear the thickest portions of the polysilicon layer is further undesirable because it can damage the structures under the thinner portions of the polysilicon layer. On the other hand, if the etch time is insufficient, stringers of unetched polysilicon may be left on the surface of the device. One such stringer is indicated by reference numeral 40 in FIG. 3. Stringers left on the surface of the device at intermediate stages in the manufacturing process can act as electrical shorts in the finished device and so are quite undesirable.

Certain embodiments of the present invention provide a better planarized surface on which subsequent processing steps can be performed. For example, a thick oxide layer can be deposited over the transfer FETs as an interlayer dielectric layer and then chemical mechanical polishing (CMP) can be used to provide a planarized surface for further processing steps. In these embodiments, openings are formed through the planarized oxide layer to a source/drain region of the transfer FET and the lower capacitor electrode is formed within the opening and partially on the surface of the planarized oxide layer. These embodiments of the invention provide improved planarity that is better suited for high resolution photolithography and for more controlled etch processes than is the uneven surface of the structure illustrated in FIGS. 1–3. Embodiments of DRAMs which incorporate planarized interlayer dielectrics are particularly preferred when the DRAM charge storage capacitor incorporates a high dielectric constant material as the capacitor dielectric. High dielectric constant materials include, for example, tantalum pentoxide ($Ta_2O_5$), barium strontium titanate (BST) and lead zirconate titanate (PZT). These high dielectric constant materials are frequently used in conjunction with conductive materials other than polysilicon at least on the surface of capacitor electrodes. For example, high dielectric constant materials might be used with upper or lower electrodes which include titanium nitride, tungsten, tungsten nitride, rhuthenium, platinum, iridium, molybdenum or manganese. At least some of these materials have poor etching selectivities with respect to the silicon oxide typically used as the interlayer dielectric layer. The poor etching selectivities exhibited by some of these electrode materials makes it difficult to control the electrode definition etch processes to ensure that the materials are etched through without undesirably etching and damaging other structures within the DRAM. Thus, the better predictability associated with this structure and method is particularly useful in the manufacture of DRAMs incorporating high dielectric constant materials as capacitor dielectrics.

When forming high density DRAMs, it is generally necessary to provide contact holes to the source/drain regions of the transfer FETs both for the formation of charge storage capacitors and for bit line contacts. For example, preferred embodiments of a DRAM in accordance with the present invention provide a thick oxide layer over the transfer FETs, planarize the thick oxide layer, and then form both lower capacitor electrodes and bit line contacts on and extending through thick portions of the planarized oxide layer. Often, providing contact holes to the source/drain regions of the transfer FETs requires etching anisotropically through thousands of angstroms of oxide interlayer dielectric, which is a long process with little control that might undesirably extend into the source/drain regions of the transfer FETs. Another aspect of the present invention provides a DRAM which includes an etch stop layer over the transfer FET and over the FET's source/drain regions and beneath the thick oxide layer that covers the transfer FET. This etch stop layer can be used for forming self-aligned contacts for both the lower capacitor electrode and the bit line contact. Not only does this preferred process allow for the more precise location of the contact holes, but also limits overetching of the source/drain regions which can lead to overly resistive source/drain regions. It will be appreciated that these aspects of the present invention are particularly well suited for use with the embodiments of the invention which provide a planarized oxide layer over the transfer FETs before the lower capacitor electrode and bit line contact are formed.

Particularly preferred embodiments of the present invention are now described with reference to FIGS. 4–11. It should be understood that, although the following describes a bit line over capacitor DRAM structure, aspects of the present invention find application to capacitor over bit line structures as well. Referring first to FIG. 4, a small portion of a DRAM in accordance with preferred embodiments of the invention is illustrated at an intermediate stage in the manufacturing process. The partially completed device is formed on a silicon substrate 50 that is provided with device isolation structures 52. In the illustrated embodiment, the device isolation structures 52 are field oxide regions formed using a standard local oxidation of silicon (LOCOS) process. In alternate embodiments, the device isolation structures might, for example, be shallow trenches filled with a CVD oxide. Although shallow trench isolation would reduce some of the surface unevenness associated with conventional manufacturing processes, it is believed that the present invention will nevertheless find application in such lower profile devices. Even though shallow trench device isolation structures have a lower profile, the wiring lines and gate electrodes still introduce considerable levels of surface unevenness that can be reduced through application of the present invention. The device isolation structures 52 serve to define the active region on which the transfer FETs of the DRAM are to be formed.

A gate oxide layer 54 is grown on the surface of the substrate in the active region, typically to a thickness of about 30–200 Å by a thermal oxidation process in an oxygen environment at a temperature of 800–1000° C. A layer of polysilicon is deposited by LPCVD over the surface of the device to a thickness of 1000–3000 Å and more preferably to a thickness of approximately 1500 Å. The layer of polysilicon is either doped in situ during deposition or by ion implantation, typically using arsenic or phosphorus in the conventional fashion. A layer of a metal or metal silicide is then provided over the surface of the polysilicon layer. The metal layer is preferably tungsten silicide ($WSi_x$) or titanium silicide ($TiSi_x$) having a thickness of about 1500 Å which may be deposited directly by chemical vapor deposition or by using sputtering or another physical vapor deposition technique. After the silicide layer is provided on the polysilicon layer, a layer of silicon oxide is deposited over the silicide layer, typically by CVD to a thickness on the order of 500–3000 Å. This oxide layer protects the gate electrode during subsequent processing steps and may be used as an etch stop in some embodiments of the invention.

The three layer structure of silicon oxide over tungsten or other silicide over polysilicon is then patterned using conventional photolithography to form an array of gate electrodes 56 consisting of a lower layer of polysilicon 58 covered by a layer of tungsten silicide 60, or another refractory metal silicide, which in turn is covered by oxide layer 62. Similarly, the wiring lines 66 include a lower layer of polysilicon 68 covered by a layer of tungsten silicide 70, or another refractory metal silicide, covered by oxide layer 72. Lightly doped portions of source/drain regions are formed by ion implantation self-aligned to the gate electrodes 56 and device isolation regions 52 in the conventional manner. More heavily doped portions of the LDD source/drain regions are formed by first depositing a layer of insulating material over the gate electrodes, etching back to form spacers on either side of the gate electrodes, and then implanting a second dosage of dopant ions to the source/drain regions self-aligned to the spacers. For example, a layer of silicon oxide can be deposited by chemical vapor deposition (CVD) to a thickness of, for example, 1000–2000 Å. The silicon oxide layer is then etched back to expose the surface of the source/drain regions 80, 82, and 84 to form spacers 64 alongside the gate electrodes 56, preferably in a reactive ion etching (RIE) process using an etchant including ions derived from $CF_4$ in a plasma environment. Typically, the sidewall spacer etching process will remove the gate oxide from the surface of the source/drain regions. If some residue of the gate oxide layer remains over the source/drain regions after the spacer etch, it is preferred that the surface of the source/drain regions be cleaned of such residue prior to forming capacitor electrodes or bit line contacts to the source/drain regions. Sidewall spacers 74 are normally formed alongside wiring lines 66 at the same time the sidewall spacers 64 are formed alongside the gate electrodes. Implantation is performed to complete the source/drain regions 80, 82 and 84 of the illustrated FETs. In certain instances, it is preferred to not utilize an LDD structure for the source/drain regions and instead to use a single doping to produce more uniformly doped source/drain regions. For such embodiments, it is still preferred that the sidewall spacers be provided to protect the sidewalls of the gate electrodes from being exposed. It should further be noted that both more and less complicated gate electrode structures and wiring line structures might be used. The remainder of the figures illustrate a simplified structure including a lower layer of polysilicon covered by a layer of an insulating silicon oxide.

Figure 5:
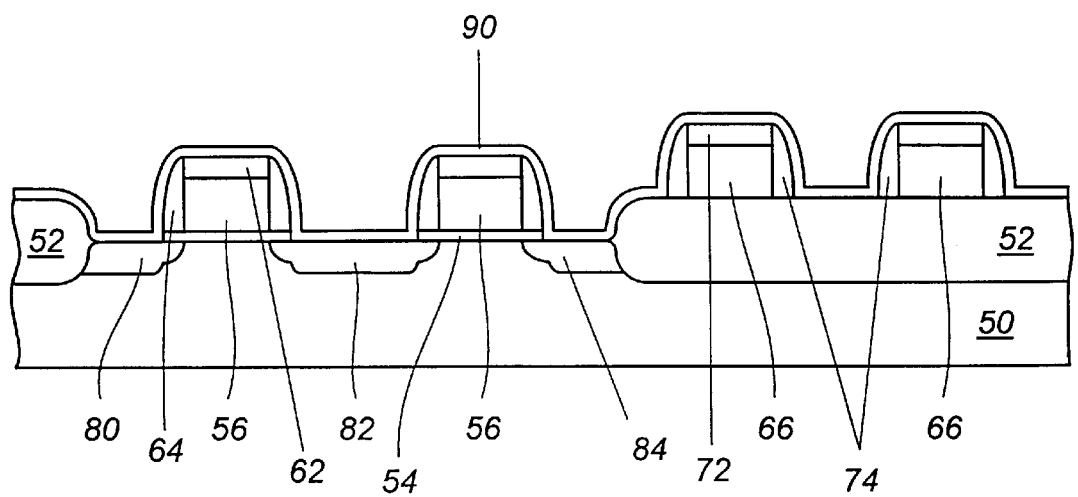

Referring now to FIG. 5, a layer 90 of etch stop material is deposited over the surface of the device, generally with the layer of etch stop material deposited directly on the surface of the source/drain regions or separated from the source/drain regions by a thin oxide layer. The etch stop material functions to protect the source/drain regions from being etched, and consequently suffering an increased resistance, during the etching of openings through thick dielectric layers that cover the source/drain regions. Preferably, the etch stop layer 90 is a layer of silicon nitride deposited by CVD to a thickness of from 100–500 Å. The etch stop layer is preferably thin to ensure that etching of the etch stop layer can be performed rapidly and with a high level of confidence as to the end of the etching process. The etch stop layer is preferably sufficiently thick so that an etching process through a thick (2000–10,000 Å) layer of dielectric material such as silicon oxide can reliably be stopped on the etch stop layer 90. The etch stop layer is preferably different from the dielectric layer that is formed over the etch stop layer. In this sense, the sufficiency of the difference between the materials used for the etch stop layer and the overlying dielectric layer is determined by whether an appropriate etchant exists that can readily distinguish between the dielectric layer and the etch stop layer. It is further preferred, but not as important, that the etch stop layer be different in the same sense from the underlying doped silicon regions. Silicon nitride is an appropriate choice for the etch stop layer because modem, commercially available etching systems can provide high levels of selectivity between silicon nitride and the silicon oxides that are typically used as interlayer dielectric materials. In addition, most of the etch chemistries available for silicon nitride have high levels of selectivity with respect to silicon.

Figure 6:
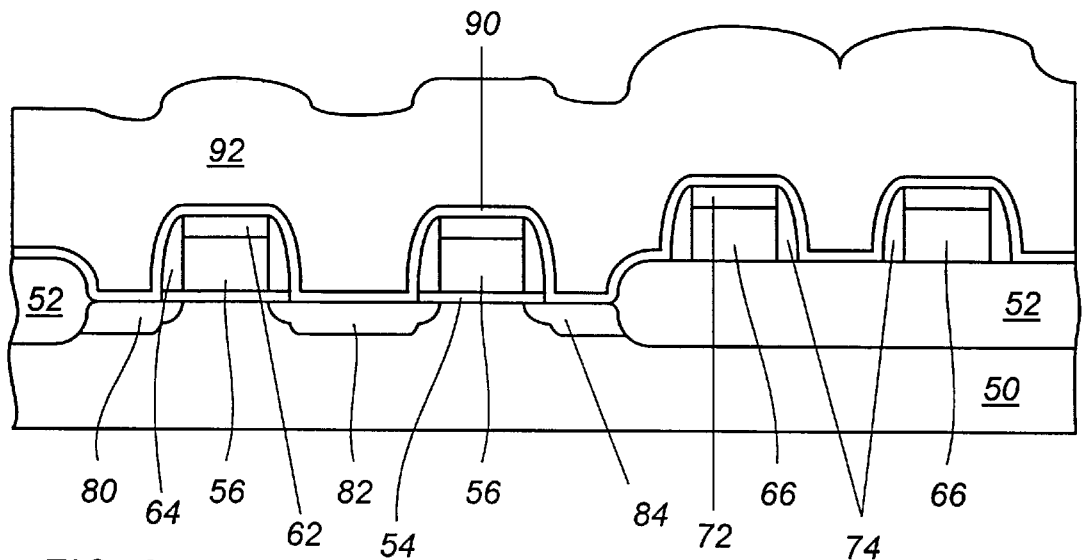
Figure 7:
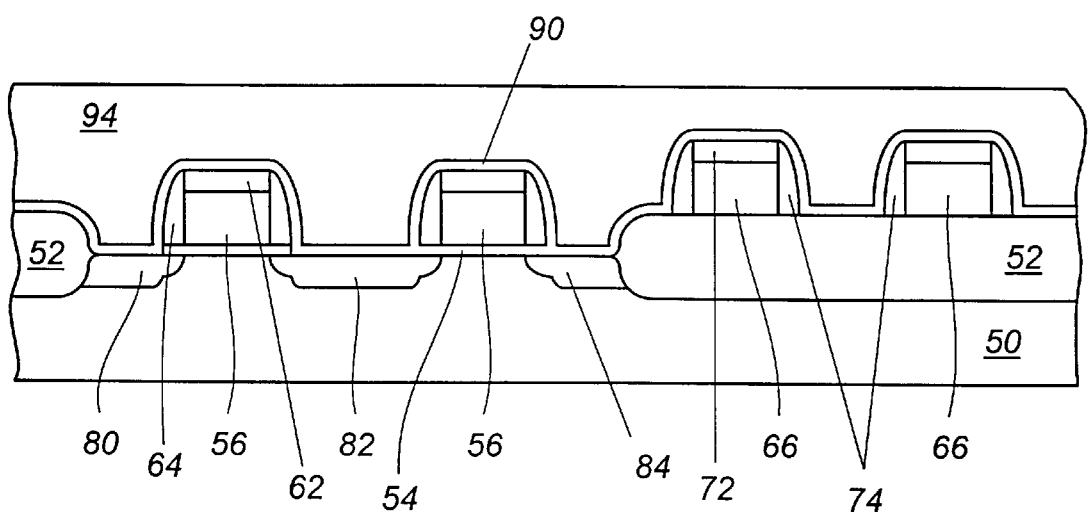
Figure 8:
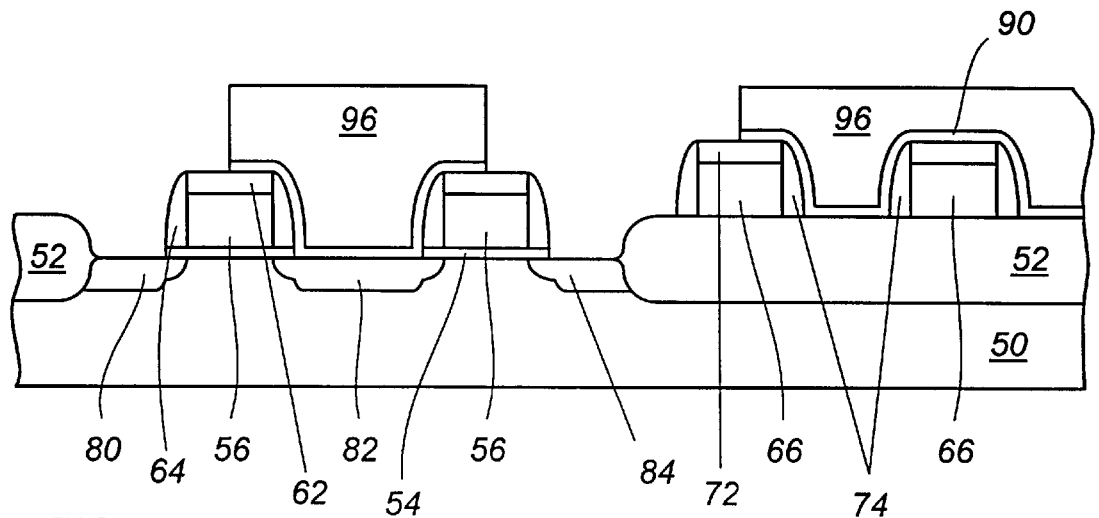

Referring now to FIG. 6, a thick layer 92 of dielectric material is deposited over the surface of the transfer FETs and the wiring lines. The interlayer dielectric 92 may, for example, be silicon oxide deposited by a CVD process using a TEOS source gas or the dielectric layer may be one of the other known dielectric materials. The interlayer dielectric 92 is deposited to a thickness of 10,000 Å or more over the device. Next, the device is planarized, preferably using a CMP process to form a planarized dielectric layer 94 (FIG. 7). Preferably, a significant thickness of planarized dielectric layer 94 is left above the source/drain regions 80, 84 on which capacitor electrodes are to be formed, since a greater thickness contributes to the capacitance of the charge storage capacitor. A mask is formed over the planarized interlayer dielectric 94 and then openings are etched through the interlayer dielectric 94 above source/drain regions 80, 84. Because the etch stop layer 90 covers the transfer electrodes, the device isolation structures 52 and the wiring lines, this etching step opens contacts on the substrate for the lower electrodes of the charge storage capacitor in a self-aligned manner. The openings are etched, preferably using an anisotropic process in a high density plasma etcher with a plasma derived from a mixture of source gases including $C_4F_8$, CHF$_3$ or CH$_3$F and CO or CO$_2$ and O$_2$ and Ar. This etch step preferably stops on the etch stop layer 90 and leaves portions of the dielectric layer 96 over other parts of the device. The etch mask is removed either at this time or before removing the etch stop layer. The etch stop layer is then etched within the openings within the remaining dielectric layer 96, using, for example, an anisotropic etching process with a plasma derived from CHF$_3$. Alternately, a wet etch using hot phosphoric acid could be used to remove the etch stop layer from within the openings in the dielectric layer 96. After the etching steps, not only the surfaces of source/drain regions 80, 84 but also surfaces of the oxide layer 62 and the spacer 64 are preferably exposed and clean, as shown in FIG. 8.

Next, lower electrodes of the charge storage capacitors are formed. In the embodiment illustrated in FIG. 9, the lower electrodes 98 include a lower layer of conventional polysilicon covered by a layer of "rugged" or hemispherical grained polysilicon (HSG-Si). To form this structure, a layer of conventional polysilicon is deposited by low pressure chemical vapor deposition (LPCVD) at 620° C. from silane (SiH$_4$) onto the source/drain electrodes and over the layer of silicon oxide 96 above a silicon substrate. The layer of conventional polysilicon is preferably doped in situ during deposition, by ion implantation and annealing, or by a thermal diffusion process, all of which are well known. For example, the conventional polysilicon layer may be highly doped N-type by implantation of phosphorus ions followed by a rapid thermal anneal at a temperature of 1000–1100° C. for about 10–30 seconds. A plate of conventional polysilicon that will form the core of the lower electrode is defined from the layer through photolithography and etching, preferably before the layer of HSG-Si is provided on the plate. Typically, the layer of conventional polysilicon has a thickness on the order of 1000–1500 Å.

It is preferred that the HSG-Si growth process be initiated on a clean silicon surface by cleaning native oxide from the surface of the polysilicon layer before depositing the HSG-Si. A distinct cleaning step may be unnecessary if the growth of the HSG-Si layer is initiated immediately after forming the underlying layer of silicon, if the surface of the underlying silicon layer is maintained in a sufficient vacuum to prevent oxide growth. More practically, it is to be expected that there will be a time interval between the growth of the underlying silicon layer and the initiation of HSG-Si growth. Alternately, if the layer of polysilicon is doped by implantation and annealing or by thermal diffusion, a layer of oxide will be grown on the surface of the layer of polysilicon. Accordingly, the surface of the underlying silicon layer is preferably cleaned before the initiation of HSG-Si growth. Native oxides may be cleaned from the surface of polysilicon by a variety of techniques, including HF dip, spin-etching using HF, vapor BF cleaning, or by an H$_2$ plasma cleaning. Preferably, the surface of the underlying silicon layer is hydrogenated as a result of the cleaning operation, because the hydrogenated surface serves to protect the polysilicon surface from reoxidation. Each of the cleaning techniques listed above will achieve the desired hydrogenation of the polysilicon surface.

Figure 9:
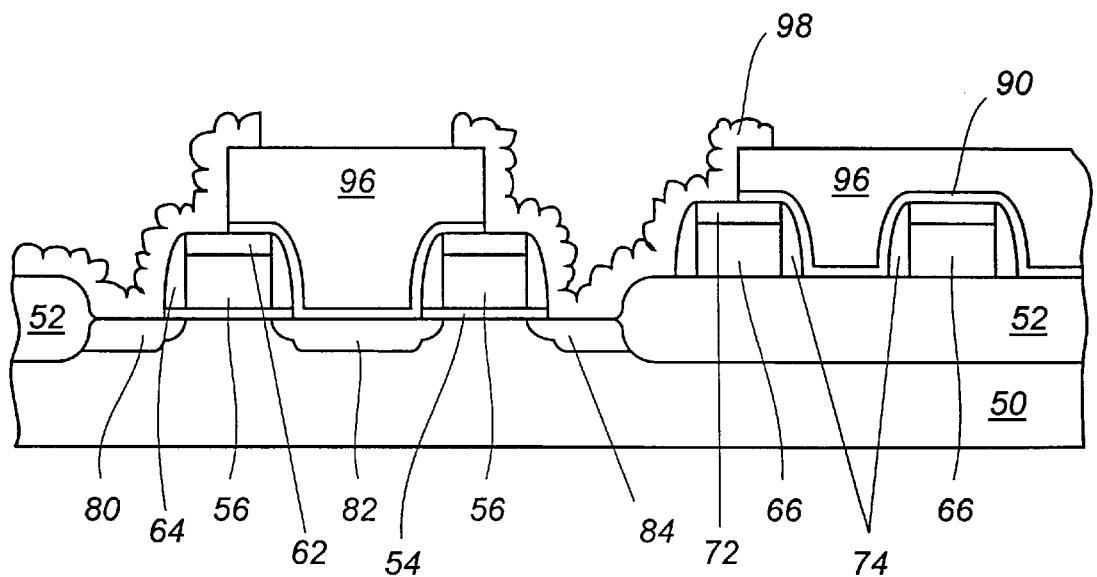

After cleaning, a layer of HSG-Si is formed on the surface of the conventional polysilicon layer. The layer may be formed in any of the well-known methods and may consist of depositing HSG-Si by LPCVD from a silane source gas onto a substrate held at a temperature of between 555° C. to 595° C. The resulting structure is shown in FIG. 9 as lower electrode 98, and includes an irregular surface of HSG-Si. Due to the random nature of the nucleation of HSG-Si growth, it is likely that the underlying doped polysilicon layer will be exposed at particularly sparse regions in the layer of HSG-Si. Growth of a layer of HSG-Si on the surface of a layer of polysilicon has been observed to increase capacitance by approximately a factor of 1.8 times over the capacitance provided by the smooth surface of the core polysilicon plate. An etch back process (using, for example a plasma etchant derived from HCl and HBr) is typically performed to remove the HSG-Si from the dielectric layers 96 and to remove at least a portion of the HSG-Si from the surface of the core polysilicon layer. Any remaining HSG-Si may then be doped by implantation or outdiffusion from the core polysilicon.

Figure 10:
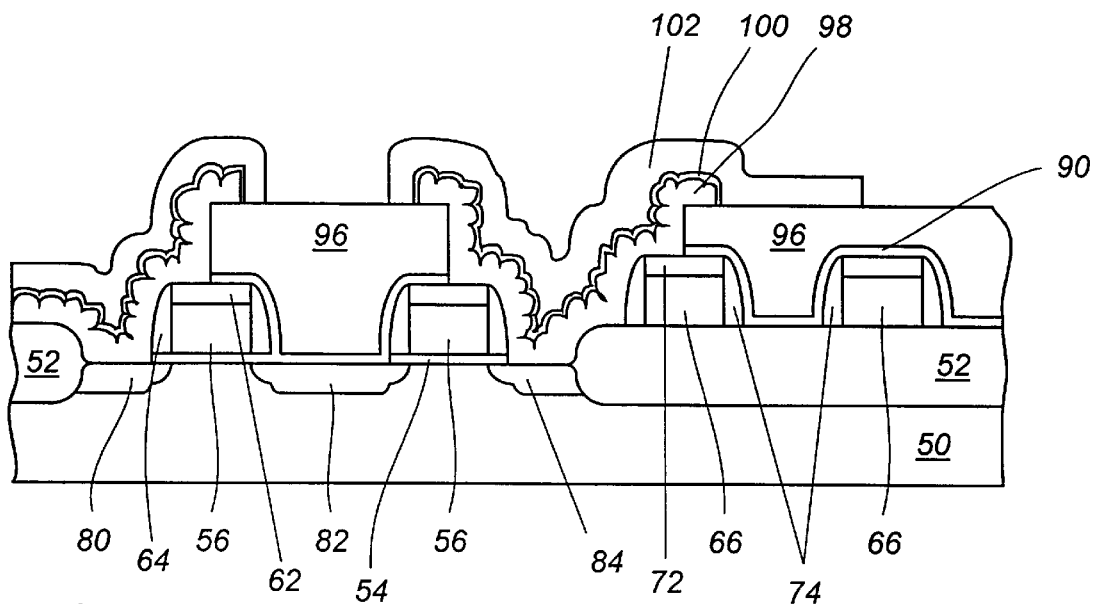
Figure 11:
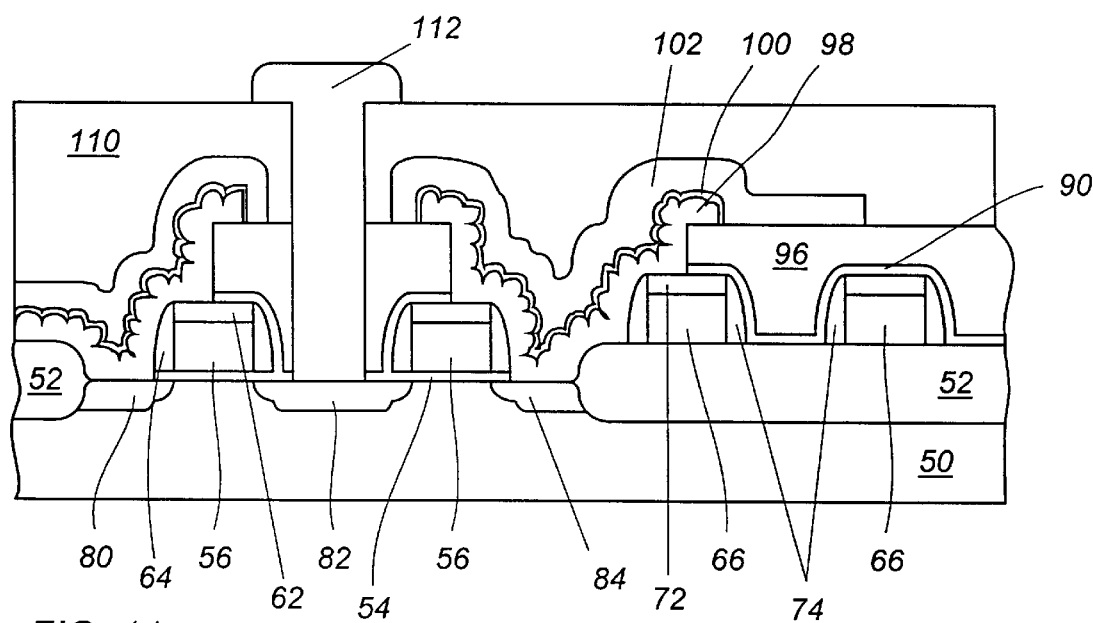

A layer 100 of capacitor dielectric is then provided over the surface of the lower gate electrodes (FIG. 10). The layer of capacitor dielectric may be a thin, two layer structure consisting of a lower layer of silicon nitride covered by a surface layer of silicon oxide. Upper capacitor electrodes 102 are then provided by depositing a layer of conventional polysilicon by LPCVD, doping the polysilicon layer, and patterning the layers to laterally define the extent of the upper capacitor electrodes. Next, another thick layer 110 of dielectric material is provided over the device, preferably a silicon oxide layer formed by plasma enhanced CVD, and then the thick layer 110 of dielectric material is planarized by CMP. A bit line contact mask is then provided over the surface of the second interlayer dielectric 110 and a bit line contact is etched through the dielectric layer 110, with the etch process stopping on the etch stop layer 90, in the manner described above with respect to the source/drain regions 80, 84. It should be noted that this etching process is also performed in a self-aligned manner to provide extended margins for alignment. The etch stop layer is then removed and then the bit line contact 112 is formed in the conventional manner.

In an alternative embodiment, a high dielectric constant material is used as the capacitor dielectric. For this alternate embodiment, the lower capacitor electrode might include the conventional polysilicon and hemispherical polysilicon 98 illustrated in FIG. 9. If such a polysilicon electrode is used, it is preferred that the surface of the polysilicon layer be coated with a thin layer of silicon nitride before forming the high dielectric constant dielectric layer, which typically include significant levels of oxygen as a constituent element. This might be accomplished by exposing the conventional polysilicon or hemispherical grained polysilicon surface to a rapid thermal nitridation (RTN) process. RTN might be performed by heating the FIG. 9 device to a temperature of about 800° C. for between thirty seconds and one minute in an ammonia (NH$_3$) environment. Alternately, the lower electrode might be formed from titanium nitride, tungsten nitride, tungsten, ruthenium, platinum, iridium, molybdenum or molybdenum nitride. The layer of capacitor dielectric 100 of FIG. 10 may then be a high dielectric constant material such as tantalum pentoxide (Ta$_2$O$_5$), barium strontium titanate (BST) and lead zirconate titanate (PZT). Generally speaking, the term "high dielectric constant materials" may generally be applied to those materials which have dielectric constants greater than silicon nitride. These high dielectric constant materials are frequently used in conjunction with conductive materials as the upper capacitor electrode. In such circumstances, the upper capacitor electrode 102 in FIG. 11 might be titanium nitride, tungsten, tungsten nitride, rhuthenium, platinum, iridium, molybdenum, manganese or other materials compatible with such high dielectric constant materials.

The present invention has been described in terms of certain preferred embodiments. Those of ordinary skill in the art will appreciate that certain modifications and variations on the embodiments described herein may be made within the general spirit of the present invention. As such, the scope of the present invention is not to be limited to the particular embodiments described herein. Rather, the scope of the present invention is to be determined from the claims which follow.

What is claimed:

1. A method of forming a DRAM, comprising the steps of:
   providing a substrate having device isolation structures formed thereon, wherein an active device region is defined between the device isolation structures;
   providing a gate oxide layer on the substrate over the active device region;
   providing first and second transfer transistors in the active device region, wherein
      the first transfer transistor includes a first gate electrode disposed over the gate oxide layer, first spacers on sidewalls of the first gate electrode, and first and second source/drain regions,
      the second transfer transistor includes a second gate electrode disposed over the gate oxide layer, second spacers on sidewalls of the second gate electrode, the second source/drain region, and a third source/drain region,
      such that the first transfer transistor and the second transfer transistor share the second source/drain region, and
      surfaces of the first, second, and third source/drain regions are exposed;
   forming an etch stop layer on the first and second gate electrodes, the first and second spacers, and the exposed surfaces of the first, second, and third source/drain regions;
   forming a dielectric layer over the etch stop layer, wherein the dielectric layer has a composition that is different than a composition of the etch stop layer;
   planarizing a surface of the dielectric layer;
   etching through the dielectric layer above the first and third source/drain regions, stopping the etching process on the etch stop layer, performing a further etching process to etch through the etch stop layer, and then forming a lower electrode in contact with the first and third source/drain regions, having a rugged surface; and
   sequentially forming a high dielectric constant dielectric layer and an upper electrode on the lower electrode to form a charge storage capacitor.

2. The method of claim 1, wherein the step of planarizing the surface of the dielectric layer is performed prior to the step of etching through the dielectric layer above the third source/drain region.

3. The method of claim 2, wherein the step of planarizing is accomplished using chemical mechanical polishing.

4. The method of claim 2, wherein the step of planarizing is performed prior to the step of etching through the dielectric layer above the first source/drain region.

5. The method of claim 1, wherein the dielectric layer is an oxide of silicon and the etch stop layer is silicon nitride.

6. The method of claim 1, wherein the etch stop layer is formed in contact with the first, second, and third source/drain regions.

7. The method of claim 1, wherein the etch stop layer is separated from the first and second gate electrodes by a layer of oxide.

8. The method of claim 6, wherein the etch stop layer is silicon nitride and the dielectric is an oxide of silicon.

9. The method of claim 1, wherein the charge storage capacitor includes the upper electrode, the high dielectric constant dielectric layer, and the lower electrode in contact with the first and third source/drain regions.

10. The method of claim 9, wherein the high dielectric constant dielectric is chosen from the group consisting of tantalum oxides and titanates.

11. The method of claim 9, wherein the high dielectric constant dielectric is chosen from the group consisting of $Ta_2O_5$, BST and PZT.

12. The method of claim 9, wherein the upper electrode faces on the high dielectric constant dielectric layer with a conductive material other than polysilicon.

13. The method of claim 12, wherein the upper electrode comprises a layer of material selected from the group consisting of titanium nitride, tungsten, tungsten nitride, platinum, rhuthenium, iridium, molybdenum and molybdenum nitride.

14. A method of forming a DRAM, comprising the steps of:
   providing a substrate having device isolation structures formed thereon, wherein an active device region is defined between the device isolation structures;
   providing a gate oxide layer on the substrate over the active device region;
   providing a transfer transistor in the active device region, the transfer transistor including a first gate electrode over the gate oxide layer, a spacer formed on a sidewall of the first gate electrode, and source/drain regions formed in the substrate, wherein the source/drain regions have exposed upper surfaces;
   forming an etch stop layer on the first gate electrode, the spacer, and the source/drain regions;
   forming a dielectric layer over the etch stop layer, wherein the dielectric layer has a composition that is different than a composition of the etch stop layer;
   planarizing the surface of the dielectric layer to provide a planarized surface;
   etching through the planarized surface of the dielectric layer above one of the source/drain regions, stopping the etching process on the etch stop layer, performing a further etching process to etch through the etch stop layer, and then forming a bit line contact to the one of the source/drain regions;
   etching through the planarized surface of the dielectric layer above another of the source/drain regions, stopping the etching process on the etch stop layer, performing a further etching process to etch through the etch stop layer to expose the surface of the source/drain region and the spacer, and then forming a lower capacitor electrode in contact with said another of the source/drain regions, having a rugged surface; and
   sequentially forming a high dielectric constant dielectric layer and an upper electrode on the lower electrode to form a charge storage capacitor.

15. The method of claim 14, wherein the step of forming a dielectric layer includes chemical vapor deposition from a TEOS source gas.

16. The method of claim 15, wherein the step of planarizing is accomplished using chemical mechanical polishing.

17. The method of claim 14, wherein the dielectric layer is an oxide of silicon and the etch stop layer is silicon nitride.

18. The method of claim 17, wherein the etch stop layer is formed on the source/drain regions.

19. The method of claim 14, wherein the charge storage capacitor includes the lower electrode in contact with said another of the source/drain region, the high dielectric constant dielectric layer, and the upper electrode.

20. The method of claim 19, wherein the high dielectric constant dielectric is chosen from the group consisting of tantalum oxides and titanates.

21. The method of claim 20, wherein the high dielectric constant dielectric is chosen from the group consisting of $Ta_2O_5$, BST and PZT.

22. The method of claim 20, wherein the upper electrode faces on the high dielectric constant dielectric layer with a conductive material other than polysilicon.

23. The method of claim 21, wherein the upper electrode comprises a layer of material selected from the group consisting of titanium nitride, tungsten, tungsten nitride, platinum, rhuthenium, iridium, molybdenum and molybdenum nitride.

24. A method of forming a DRAM, comprising the steps of:

providing a substrate having device isolation structures formed thereon, wherein an active device region is defined between the device isolation structures;

providing a gate oxide layer on the substrate over the active device region;

providing a transfer transistor in the active device region, the transfer transistor including a first gate electrode over the gate oxide layer, a spacer on a sidewall of the first gate electrode, and source/drain regions formed in the substrate, wherein the source/drain regions have exposed upper surfaces;

forming an etch stop layer on the first gate electrode, the spacer, and the source/drain regions;

forming a dielectric layer over the etch stop layer, wherein material forming the dielectric layer is different than material forming the etch stop layer, and wherein material forming the etch stop layer is different than material forming the spacer;

chemical mechanical polishing the surface of the dielectric layer to provide a planarized surface;

etching through the planarized surface of the dielectric layer above one of the source/drain regions, stopping the etching process on the etch stop layer, performing a further etching process to etch through the etch stop layer, removing a portion of the gate oxide layer to expose at least a portion of said one of the source/drain regions, and then providing a conductor in contact with said one of the source/drain regions;

etching through the planarized surface of the dielectric layer above another of the source/drain regions, stopping the etching process on the etch stop layer, performing a further etching process to etch through the etch stop layer, and then forming a lower electrode having a rugged surface, in contact with said another of the source/drain regions; and sequentially forming a high dielectric constant dielectric layer and an upper electrode on the lower electrode to form a charge storage capacitor.

25. The method of claim 24, wherein the high dielectric constant dielectric is chosen from the group consisting of tantalum oxides and titanates.

26. The method of claim 24, wherein the high dielectric constant dielectric is chosen from the group consisting of $Ta_2O_5$, BST and PZT.

27. The method of claim 24, wherein the upper electrode faces on the high dielectric constant dielectric layer with a conductive material other than polysilicon.

28. The method of claim 24, wherein the upper electrode comprises a layer of material selected from the group consisting of titanium nitride, tungsten, tungsten nitride, platinum, rhuthenium, iridium, molybdenum and molybdenum nitride.

* * * * *